United States Patent
Loper

(10) Patent No.: US 6,862,323 B1
(45) Date of Patent: Mar. 1, 2005

(54) LOW PASS FILTERS FOR HIGH DYNAMIC RANGE WIDEBAND DIRECT CONVERSION RECEIVER

(75) Inventor: Roger K. Loper, Montrose, CO (US)

(73) Assignee: Rockwell Collins, Cedar Rapids, IA (US)

( * ) Notice: Subject to any disclaimer, the term of this patent is extended or adjusted under 35 U.S.C. 154(b) by 784 days.

(21) Appl. No.: 09/924,819

(22) Filed: Aug. 8, 2001

(51) Int. Cl.[7] ................................................ H03K 9/00
(52) U.S. Cl. ...................... 375/316; 375/343; 455/302; 455/323; 708/314
(58) Field of Search ................................. 375/316, 343; 708/314; 455/302, 323

(56) References Cited

U.S. PATENT DOCUMENTS

| | | | | |
|---|---|---|---|---|
| 5,084,675 A | * | 1/1992 | Reinfelder et al. | ......... 324/309 |
| 5,179,730 A | * | 1/1993 | Loper | ........................ 455/266 |
| 5,230,099 A | * | 7/1993 | Loper | ........................ 455/324 |
| 6,008,706 A | * | 12/1999 | Holme et al. | ............... 333/132 |
| 6,195,539 B1 | * | 2/2001 | Galal et al. | ................. 455/302 |
| 6,631,170 B1 | * | 10/2003 | Gu | .............................. 375/316 |

* cited by examiner

Primary Examiner—Temesghen Ghebretinsae
(74) Attorney, Agent, or Firm—Nathan O. Jensen; Kyle Eppele

(57) ABSTRACT

Disclosed are a low pass filter, and a direct conversion receiver (DCR) implementing the same, which filter and second signal channels with improved phase and gain match, allowing use of the filter and DCR in wideband environments. A first M-pole filter channel, comprised of a first plurality of 2-pole active filter stages, filters the first signal channel. A second M-pole filter channel, comprised of a second plurality of 2-pole active filter stages, filters the second signal channel. One of the second plurality of 2-pole filter stages includes two variable components. The values of the variable components of the second M-pole filter channel are adjusted to match the gain and phase of the first and second filter channels.

12 Claims, 6 Drawing Sheets

LOW PASS FILTERS FOR HIGH DYNAMIC RANGE WIDEBAND DIRECT CONVERSION RECEIVER

FIELD OF THE INVENTION

The present invention relates to direct conversion receivers (DCRs). More particularly, the present invention relates to low pass filters for high dynamic range wideband DCRs.

BACKGROUND OF THE INVENTION

In DCR's, a received signal from the antenna passes through radio frequency (RF) filtering and then through an RF amplifier. The filtered and amplified signal is subjected to a quadrature mix to baseband I and Q quadrature signals. Typically, the I and Q signals are low pass filtered, amplified, and digitized by an analog-to-digital converter (ADC). The I and Q signals are processed by digital signal processing hardware and software and then passed to a digital-to-analog converter (DAC) to reconstruct usable demodulated signals or to a computer for further processing. The "tuned frequency" of a DCR is the frequency of the local oscillator from the frequency synthesizer.

The I and Q signals in a DCR only represent the received signals to the extent that they are in perfect quadrature, i.e., to the extent that they are of equal amplitude and separated in phase by exactly 90 degrees. If perfect quadrature does not exist, distortion products result when attempts are made to extract useful information from the I and Q signals. Techniques for determining and correcting these quadrature errors are known, but typically only over a narrow passband. For wideband receivers, some of these techniques cannot correct for differential errors in gain and phase across the receiver passband.

Quadrature errors are frequently a function of how perfectly the baseband low pass filters for the I and Q signals match each other. Any mismatch between the filters produces distortion products in demodulated outputs. The distortion products are typically well within what can be tolerated in a single signal receiver. However, these filter mismatches have far more serious consequences in a wideband receiver where multiple narrowband signals are captured. Receivers of this type are employed, for example, in cellular telephone base stations and by government agencies tasked with monitoring the usage of the RF spectrum. The advantage of this architecture is that a single "hardware" receiver can intercept multiple signals and they can then be individually extracted with a "software" receiver residing in a computer. Current receivers of this type are implemented with a superheterodyne architecture. A need exists for methods of reducing filter mismatches, thereby improving wideband DCR performance.

SUMMARY OF THE INVENTION

Disclosed are a low pass filter, and a direct conversion receiver (DCR) implementing the same, which filter first and second signal channels with improved phase and gain match, allowing use of the filter and DCR in wideband environments. A first M-pole filter channel, comprised of a first plurality of 2-pole filter stages, filters the first signal channel. A second M-pole filter channel, comprised of a second plurality of 2-pole filter stages, filters the second signal channel. One of the second plurality of 2-pole filter stages includes two variable components (i.e., capacitors or resistors). The values of the variable components of the second M-pole filter channel are adjusted to match the gain and phase of the first and second filter channels.

DETAILED DESCRIPTION OF AN ILLUSTRATIVE EMBODIMENT

Figure 1:
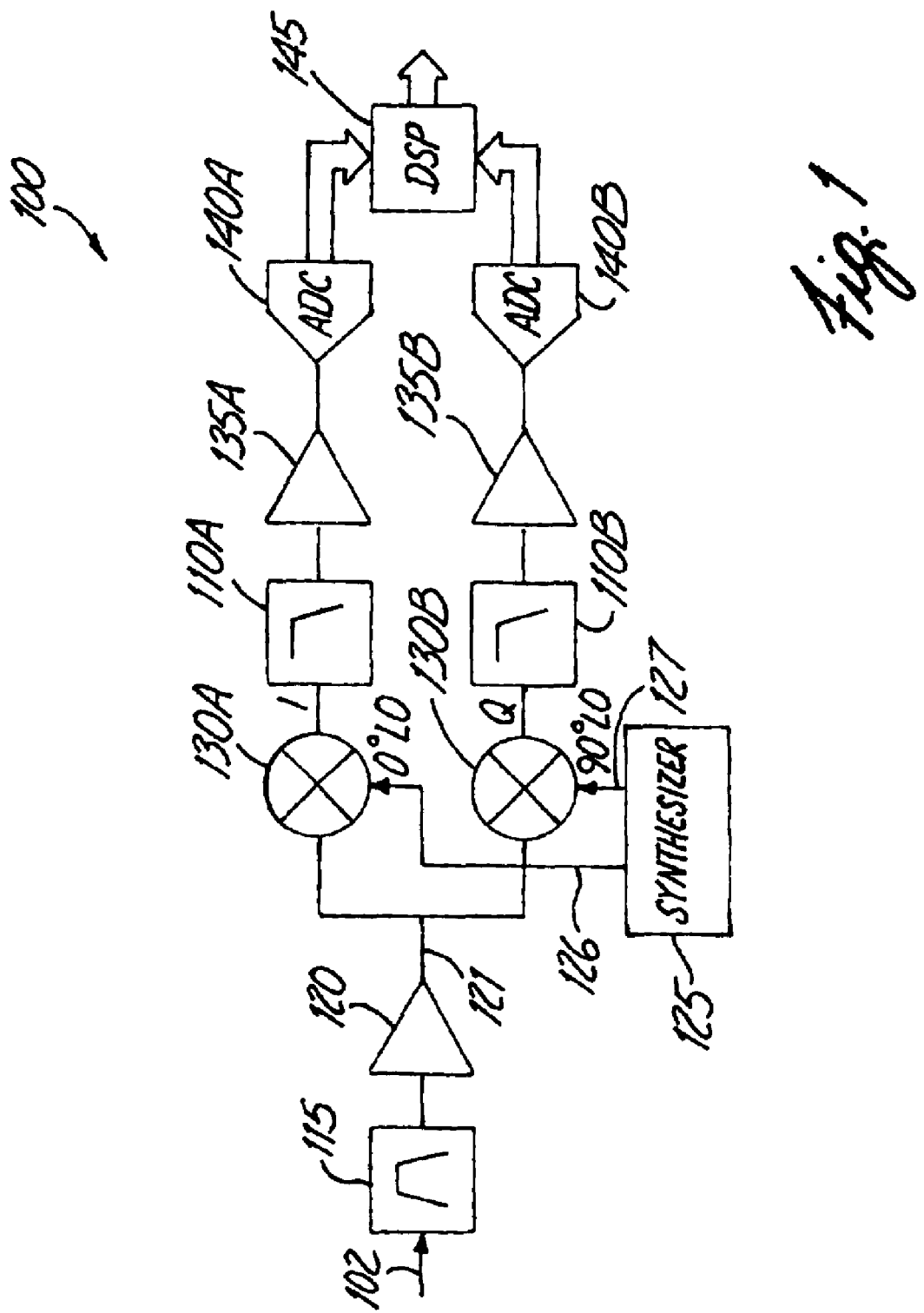
FIG. 1 is a block diagram of a typical direct conversion receiver.

FIG. 1 is a block diagram of a wideband direct conversion receiver (DCR) 100 in accordance with embodiments of the invention. DCR 100 is similar to typical prior art DCRs, but includes matched low-pass filters or filter channels 110A and 110B. Filter channels 110A and 110B can collectively be referred to as filter 110. As shown in FIG. 1, DCR 100 includes radio frequency (RF) filter 115, RF amplifier 120, synthesizer 125, mixers 130A and 130B, low pass As filter channels 110A and 110B, amplifiers 135A and 135B, analog-to-digital converters (ADCs) 140A and 140B, and digital signal processing circuitry 145. The components of DCR 100 are illustrated and described for purposes of discussion of the invention. DCR 100 can therefore include components not shown in FIG. 1, or can omit one or more of the illustrated components, without departing from the spirit and scope of the invention.

In operation, the received signal 102 from the antenna (not shown) passes through RF filtering and RF amplification provided by filter 115 and amplifier 120, respectively. The filtered and amplified signal 121 is subjected to a quadrature mix to baseband I and Q signals using mixers 130A and 130B and a synthesizer 125 providing signals 126 and 127 which have a frequency LO and are 90 degrees out of phase with each other. Synthesizer 125 provides reference signals 126 and 127, at frequency LO, to mixers 130A and 130B for the quadrature mix. The reference signals 126 and 127 are 90 degrees out of phase. The resulting I and Q signals are then also 90 degrees out of phase.

The I and Q signals are low pass filtered using matched filters or filter channels 110A and 110B, amplified using amplifiers 135A and 135B, and digitized by an analog-to-digital converter (illustrated as ADCs 140A and 140B). The I and Q signals are then processed by digital signal processing hardware and/or software (collectively illustrated as DSP145) and then passed to a digital-to-analog converter (not shown) to reconstruct usable demodulated signals or to a computer for further processing. The "tuned frequency" of a direct conversion receiver is the frequency LO of the local oscillator from the frequency synthesizer 125.

The I and Q signals in a direct conversion receiver only represent the received signals to the extent that they are in perfect quadrature, i.e., to the extent that they are of equal amplitude and separated in phase by exactly 90 degrees. If perfect quadrature does not exist, distortion products result when attempts are made to extract useful information from the I and Q signals. Mismatches in phase or gain between filter channels 110A and 110B are a significant cause of this type of distortion. These filter mismatches have far more serious consequences in a wideband receiver where multiple narrowband signals are captured.

Figure 2:
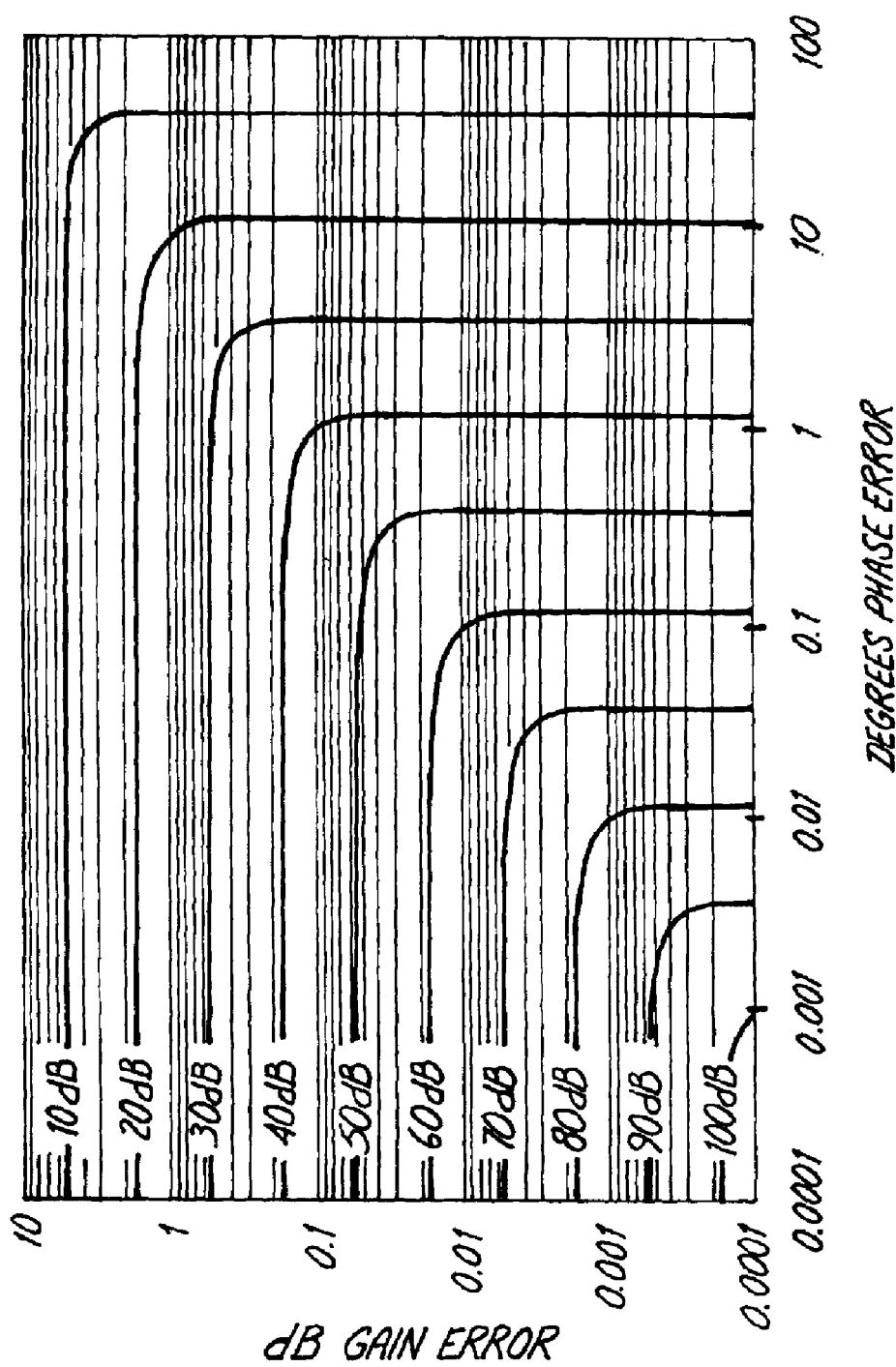
FIG. 2 is a plot illustrating direct conversion receiver image rejection as a function of quadrature error.

To illustrate the problem that results from quadrature errors, consider the following example. Assume that a wideband receiver has a bandwidth of 10 MHz. Assume that the receiver is tuned to 900 MHz, i.e., the local oscillator frequency LO is 900 MHz. It can then receive any signal in the portion of the RF spectrum that lies between 895 and 905 MHz. Assume that there is a signal at 903 MHz. It will produce baseband I and Q signals centered at 3 MHz (i.e., 903–900). If there are quadrature errors, there will also be an apparent signal located at the mirror image of the actual signal, or −3 MHz. It will appear that there was also a signal at 897 MHz. The magnitude of these image responses is related to the quadrature gain and phase errors. The relationship is shown in FIG. 2 which plots image rejection in dB as a function of gain and phase quadrature errors.

Figure 3:
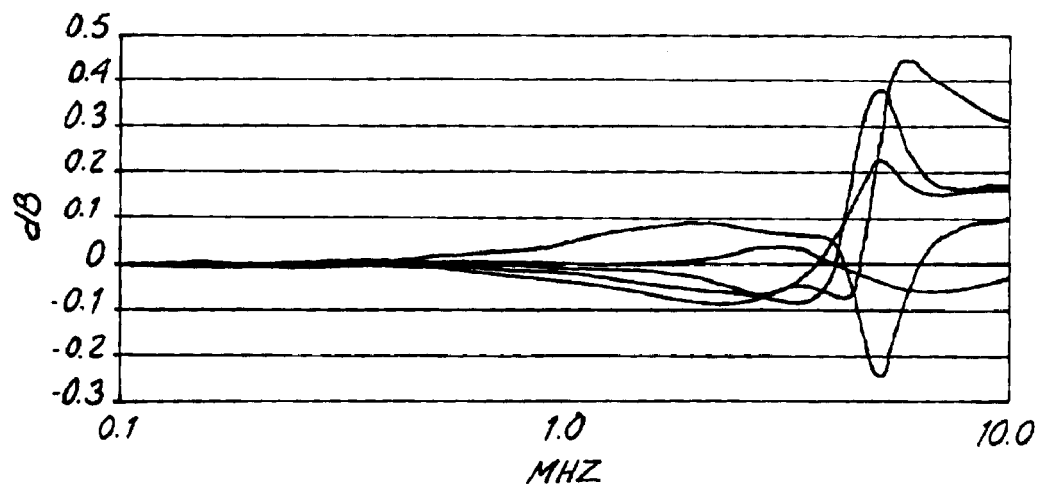
FIGS. 3 and 4 illustrate gain and phase errors, respectively, for a six pole 0.01 dB Chebyshev filter with the component values randomly varied within a ±1 percent window.
Figure 4:
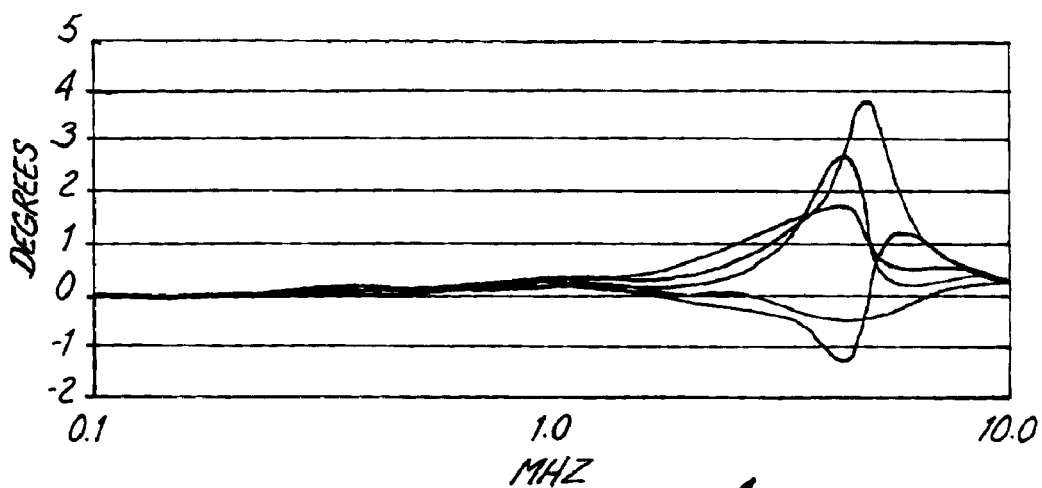

If the requirement exists of 90 dB image rejection, for example, the I and Q channels must be within approximately 0.01 degree and 0.001 dB of each other across their entire passbands. In a direct conversion receiver the filters must be "analog" filters since they perform the anti-aliasing function for the A/D converters. In a superheterodyne receiver this problem does not exist since a single "real" intermediate frequency signal is digitized and the mix to I and Q occurs digitally with no imperfections due to analog hardware. If the advantages of the architectural simplicity of the direct conversion receiver are to be realized in high dynamic range wideband receivers, the problem of low pass filter tracking must be solved. To illustrate the difficulty of the problem, consider the following example:

A six pole 0.01 dB Chebyshev filter was computer modeled. The nominal gain and phase characteristics were determined and then the component values were randomly varied within a ±1 percent window and five additional filters generated. The gain and phase of the nominal filter was subtracted from each of the five filters and the differences plotted versus frequency. The results are shown in FIGS. 3 and 4, which plot the gain variation from nominal and the phase variation from nominal, respectively, for the five filters.

Dynamic range of at least 90 dB would be desirable, but assuming the relatively modest goal of 70 dB is acceptable, one can see that this requires phase tracking of approximately 0.03 degree and gain tracking of approximately 0.003 dB. It can be seen from the previous graphs that the filters do not come close, even with one percent tolerance parts. The filters are cornered at 5 MHz, but even over only 3 MHz, image rejection is less than 30 dB. This particular set of filters holds gain to within 0.003 dB out to 229 kHz and phase to within 0.03 degree out to only 21.9 kHz.

The present invention addresses the problem of filter mismatches by using, for the matched filter channels, filters each composed of a number of identical 2-pole active filters or filter sections. One or both of the filter channels 110A and 110B has adjustable components (capacitors or resistors) in one of its 2-pole filter sections. With all of the 2-pole filters having the same nominal pole locations, it is possible to track the entire filter by adjusting just the two variable components in the one section of one channel. It is not necessary that both channels have a 2-pole section with adjustable components, though both can in order to make the filter channels as identical as possible. If both channels do have a 2-pole section with variable components, in one of the channels these variable components can have fixed biases and thus constant values such that only one channel is adjusted.

In a particular receiver configuration discussed here as a non-limiting example, quadrature mixer outputs (outputs from mixers 130A and 130B) were balanced and the proposed A/D converter (ADCs 140A and 140B) also had balanced inputs. Consequently, there were a total of 20 2-pole filter sections required to implement the 10-pole I and Q balanced filter channels 110A and 110B. The filter sections were implemented with 2-pole Butterworth sections with a total filter channel gain of 8. A block diagram of the resulting circuit is shown as FIG. 5.

Figure 5:
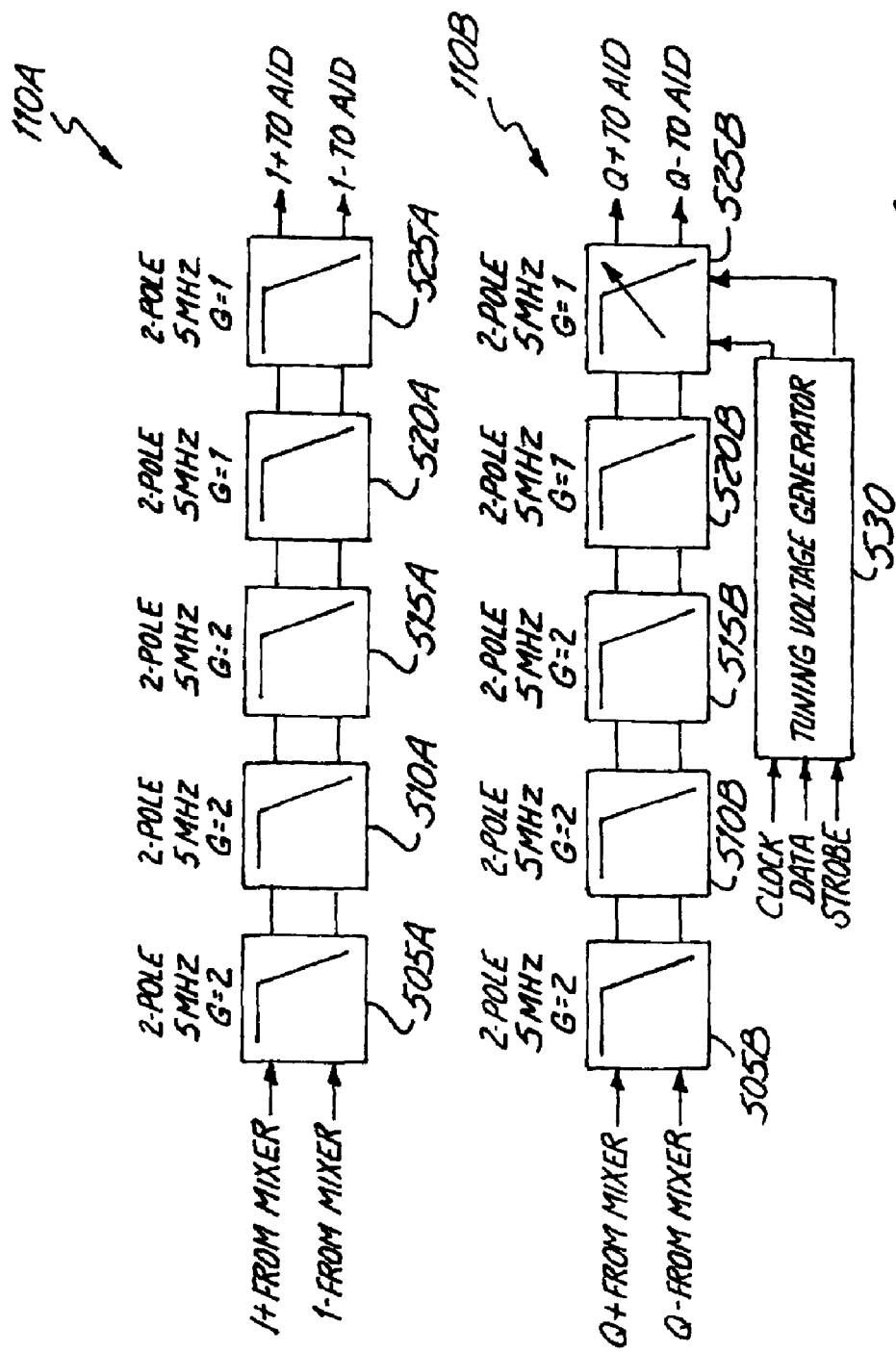
FIG. 5 is a block diagram illustrating a set of matched filter channels in accordance with the present invention.

As shown in FIG. 5, in the illustrated embodiment matched filter channels 110A and 110B each contain five 2-pole Butterworth active filters or filter sections. Filter channel 110A includes 2-pole Butterworth filters 505A, 510A, 515A, 520A and 525A. Filter 110B include 2-pole Butterworth filters 505B, 510B, 515B, 520B and 525B. Each of the I and Q channels have identical hardware. In other words, filters 505A and 505B are identical, filters 510A and 510B are identical, and so forth. The only differences between the hardware of filter channels 110A and 110B correspond to unintended variations in component values, which would lead to the filter mismatches discussed above. Tracking between filter channels 110A and 110B is done with varactors in one of the 2-pole sections in the Q channel (i.e., in filter channel 110B), but variable resistors can be used in other embodiments. In the particular embodiment illustrated, tracking is done with varactors in 2-pole filter section 525B. In the interest of keeping the I and Q channels identical, filter section 525A in the I channel (i.e., in filter channel 110A) also has varactors, but with a fixed bias. Again, the variable components in section 525A are not necessary in all embodiments. The capacitance values of the varactors in filter section 525B in the Q channel are controlled by a tuning voltage generator 530 which generates variable bias voltages. The variable capacitance elements could also be trimmer capacitors, for example, and would be adjusted with a screwdriver or alignment tool.

Figure 6:
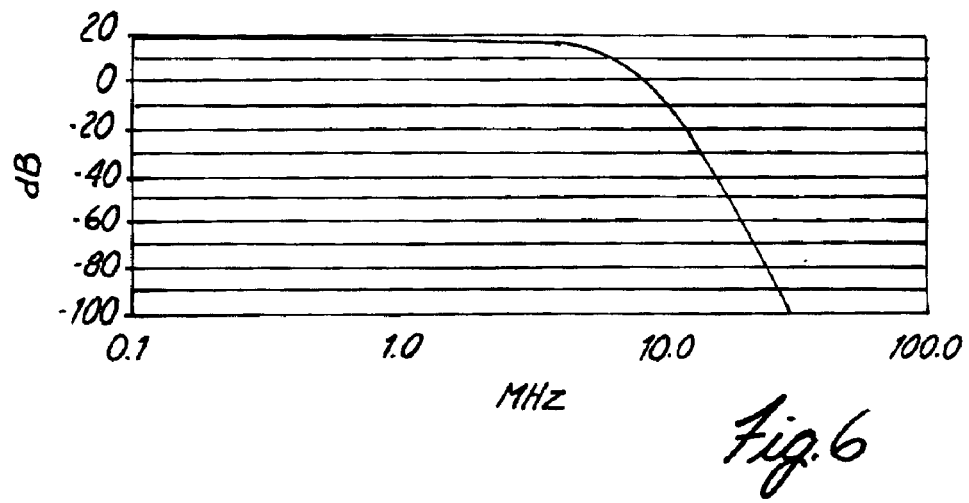
FIG. 6 is a plot illustrating the frequency response of a filter composed of five 2-pole Butterworth filters.

The frequency response of a filter composed of five 2-pole Butterworth filters is inferior to that of a true 10-pole Butterworth Filter, but it is reasonable as shown in FIG. 6. This frequency response plot is for a filter having a 3 dB corner at 5 MHz.

Figure 7:
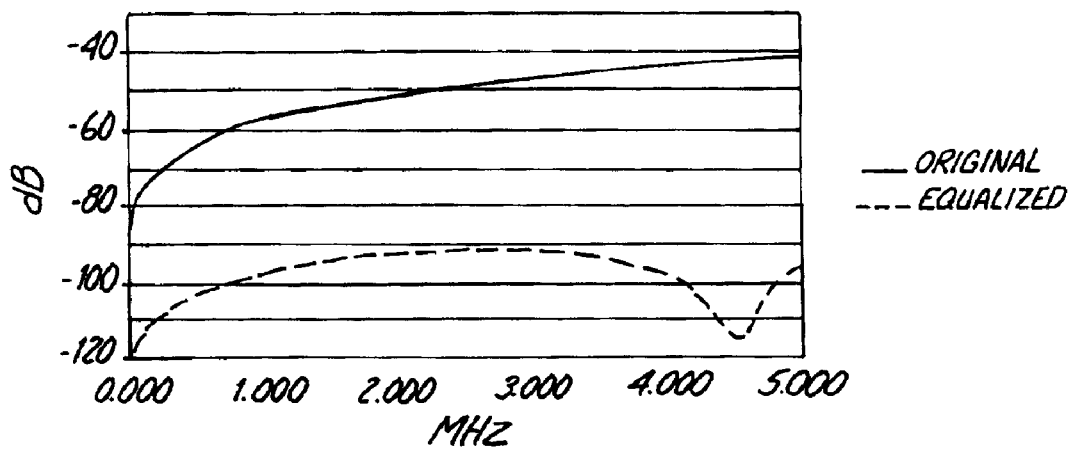
FIG. 7 is a plot illustrating modeled filter tracking results for the filter channels shown in FIG. 5, both with and without equalization.

FIG. 7 illustrates filter tracking performance for the original (un-equalized) filter channels 110A and 110B shown in FIG. 5, in comparison to the tracking performance of the same filter channels when equalized using tuning voltage generator 530 to control the capacitances of the varactors in channel 110B.

Note that the untracked filters have good image rejection at low frequencies but only about 40 dB at 5 MHz. After adjusting just two capacitors the image rejection is better than 90 dB across the entire 5 MHz band. The tracking is accomplished by adjusting the two variable capacitors for minimum gain and phase error between the two filters at a single frequency. One capacitor tends to adjust the frequency of the null and the other the depth of null. A null frequency equal to approximately 90 percent of the corner frequency appears to be optimum for minimizing gain and phase errors across the entire passband.

Figure 8:
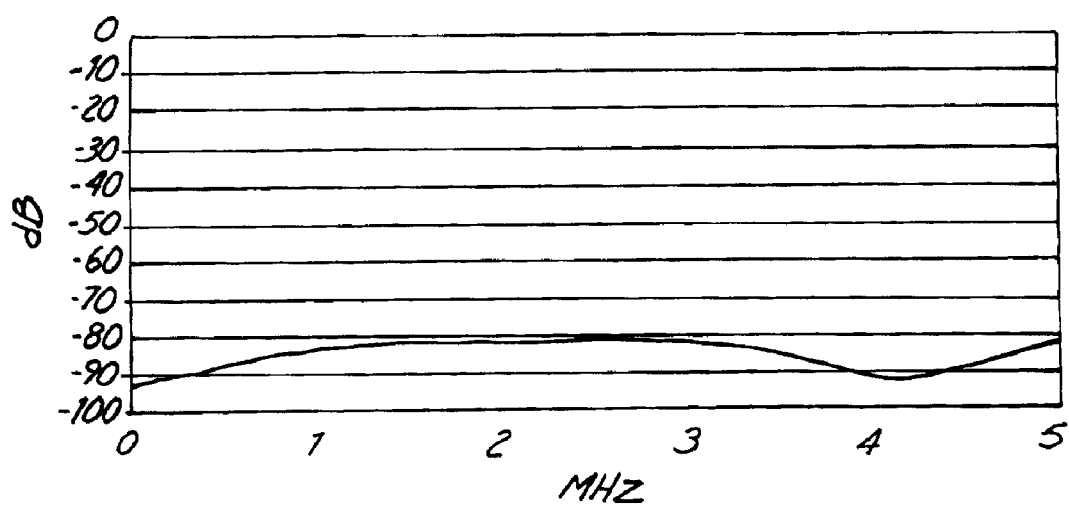
FIG. 8 is a plot illustrating data taken with two 10-pole filters implemented with wide bandwidth current feedback operational amplifiers and 1 percent tolerance resistors and capacitors.

FIG. 8 shows actual breadboard test data This data was taken with two 10-pole filters implemented with wide bandwidth current feedback operational amplifiers and 1 percent tolerance resistors and capacitors. Note that better than 80 dB image rejection is maintained across the 5 MHz band.

In summary, it has been shown how two low pass active filters of filter channels composed of multiple 2-pole sections can be tracked to have very closely matching gain and phase characteristics by adjusting just two circuit elements in one of the 2-pole sections, provided the nominal characteristics of all of the two pole sections are the same.

Although the present invention has been described with reference to illustrative embodiments, workers skilled in the art will recognize that changes may be made in form and detail without departing from the spirit and scope of the invention. For example, while the invention was illustrated using 2-pole filter sections to produce 10-pole filter channels, the concepts disclosed are applicable to 2-pole filter sections combined to create M-pole filter channels. In the illustrated embodiments, M is equal to 10, but M can be other integer multiples of 2.

What is claimed is:

1. A method of producing an M-pole low pass filter configured to simultaneously filter first and second signal channels with a high degree of phase and gain match across a passband of the first and second signal channels, the method comprising:

providing a first M-pole filter channel for filtering the first signal channel, M being an integer multiple of 2 and having a value of at least 4, the first filter channel comprising a first plurality of 2-pole low pass active filter stages coupled in series to provide M-pole filtering;

providing a second M-pole filter channel for filtering the second signal channel, the second filter channel comprising a second plurality of 2-pole low pass active filter stages coupled in series to provide M-pole filtering, wherein one of the second plurality of 2-pole low pass filter stages includes two variable components; and adjusting a bias of the two variable components of the second M-pole filter channel to variably control component values of the two variable components to match the gain and phase of the second filter channel to the gain and phase of the first filter channel across a desired passband.

2. The method of claim 1, wherein providing the second M-pole filter channel further comprises providing the second M-pole filter channel such that the two variable components include variable capacitors.

3. The method of claim 2, wherein adjusting a bias of the two variable components of the second M-pole filter channel to variably control the component values of the two variable components further includes, generating a bias voltage to variably control capacitances of the two variable capacitors.

4. The method of claim 1, wherein providing the second M-pole filter channel further comprises providing the second M-pole filter channel such that the variable components include variable resistors.

5. The method of claim 1, wherein providing the first M-pole filter channel further comprises providing the first M-pole filter channel such that one of the first plurality of 2-pole low pass filter stages includes two variable components having a fixed bias such that component values of the two variable components are constant.

6. An M-pole low pass filter configured to simultaneously filter first and second signal channels with a high degree of phase and gain match across a passband of the first and second signal channels, the low pass filter comprising:

a first M-pole filter channel for filtering the first signal channel, M being an integer multiple of 2 and having a value of at least 4, the first filter channel comprising a first plurality of 2-pole low pass active filter stages coupled in series to provide M-pole filtering;

a second M-pole filter channel for filtering the second signal channel, the second filter channel comprising a second plurality of 2-pole low pass active filter stages coupled in series to provide M-pole filtering, wherein one of the second plurality of 2-pole low pass active filter stages includes two variable components having biases which are adjusted to match the phase and gain of the second filter channel to the phase and gain of the first filter channel over a desired passband.

7. The M-pole low pass filter of claim 6, wherein each of the second plurality of 2-pole low pass active filter stages is comprised of components having values which are, within a predetermined tolerance range, equal to values of components of a corresponding one of the first plurality of 2-pole low pass active filter stages, such that the first and second filter channels are substantially identical with the exception of the component values of the two variable components which are adjusted to compensate for within-tolerance variations between components of the first filter channel and components of the second filter channel.

8. The M-pole low pass filter of claim 6, wherein the two variable components include capacitors having variable capacitances.

9. The M-pole low pass filter of claim 6, wherein the two variable components include resistors having variable resistances.

10. The M-pole low pass filter of claim 6, wherein one of the first plurality of 2-pole low pass active filter stages also includes two variable components, having fixed biases such that component values of the two variable components are constant.

11. A direct conversion receiver comprising:

radio frequency (RF) circuitry configured to generate a first signal;

quadrature mix circuitry coupled to the RF circuitry and configured to separate the first signal into separate I and Q quadrature signals; and low pass filter circuitry comprising:
a first filter channel coupled to the quadrature mix circuitry and configured to filter the I signal, the first filter channel comprising a first plurality of 2-pole low pass active filter stages coupled in series to provide M-pole filtering;
a second filter channel coupled to the quadrature mix circuitry and configured to filter the Q signal, the second filter channel comprising a second plurality of 2-pole low pass active filter stages coupled in series to provide M-pole filtering, wherein one of the second plurality of 2-pole low pass active filter stages includes two variable components having biases which are adjusted to match the phase and gain of the second filter channel to the phase and gain of the first filter channel over a desired passband.

12. The direct conversion receiver of claim 11, wherein M is an integer multiple of 2 and has a value of at least 4.

* * * * *